(12) United States Patent
Kubota et al.

(10) Patent No.: US 11,249,116 B2
(45) Date of Patent: Feb. 15, 2022

(54) MAGNETIC SENSOR AND CURRENT SENSOR

(71) Applicant: Murata Manufacturing Co., Ltd., Nagaokakyo (JP)

(72) Inventors: Masashi Kubota, Nagaokakyo (JP); Yoshimitsu Ushimi, Nagaokakyo (JP); Tetsuzo Hara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/847,708

(22) Filed: Apr. 14, 2020

(65) Prior Publication Data

US 2020/0241052 A1    Jul. 30, 2020

Related U.S. Application Data

(63) Continuation of application No. PCT/JP2018/047564, filed on Dec. 25, 2018.

(30) Foreign Application Priority Data

Jan. 25, 2018  (JP) .............................. JP2018-010645

(51) Int. Cl.
  *G01R 15/20* (2006.01)
  *G01R 19/00* (2006.01)
  *G01R 33/09* (2006.01)

(52) U.S. Cl.
  CPC ....... *G01R 15/205* (2013.01); *G01R 19/0092* (2013.01); *G01R 33/093* (2013.01); *G01R 33/096* (2013.01)

(58) Field of Classification Search
  CPC .............. G01R 15/205; G01R 33/0094; G01R 33/093; G01R 19/0092
  See application file for complete search history.

(56) References Cited

U.S. PATENT DOCUMENTS

| | | | |
|---|---|---|---|
| 5,155,644 A | * | 10/1992 | Kira ...................... G11B 5/3113 360/321 |
| 5,307,226 A | | 4/1994 | Brug et al. |
| (Continued) | | | |

FOREIGN PATENT DOCUMENTS

| | | |
|---|---|---|
| JP | 59-133476 A | 7/1984 |
| JP | 02-195284 A | 8/1990 |
| (Continued) | | |

OTHER PUBLICATIONS

Official Communication issued in International Patent Application No. PCT/JP2018/047564, dated Mar. 5, 2019.

*Primary Examiner* — Dominic E Hawkins
(74) *Attorney, Agent, or Firm* — Keating & Bennett, LLP

(57) ABSTRACT

A magnetic sensor includes a substrate, and a magneto-resistive element portion which is provided on the substrate and has a predetermined magneto-sensitive direction, and in which a bias magnetic field is applied in a direction orthogonal or substantially orthogonal to the magneto-sensitive direction. The magneto-resistive element portion includes a magnetic layer having a negative magneto-striction constant, and stress-induced anisotropy of the magnetic layer develops in a direction parallel or substantially parallel to the direction of the bias magnetic field in response to a tensile stress act on the substrate in a direction parallel or substantially parallel to the magneto-sensitive direction.

20 Claims, 8 Drawing Sheets

(56) References Cited

U.S. PATENT DOCUMENTS

| | | | |
|---|---|---|---|
| 7,842,334 B2* | 11/2010 | Wakui | B82Y 25/00 427/130 |
| 2004/0067389 A1* | 4/2004 | Hasegawa | G11B 5/3903 428/811.5 |
| 2004/0166368 A1 | 8/2004 | Gill et al. | |
| 2004/0228044 A1 | 11/2004 | Hasegawa et al. | |
| 2007/0186666 A1* | 8/2007 | Ruehrig | G01L 1/12 |
| 2008/0032423 A1* | 2/2008 | Wang | G01R 33/05 436/536 |
| 2010/0171494 A1 | 7/2010 | Yanagisawa | |
| 2017/0285075 A1* | 10/2017 | Okuyama | G01R 15/205 |

FOREIGN PATENT DOCUMENTS

| | | |
|---|---|---|
| JP | 06-61547 A | 3/1994 |
| JP | 07-244142 A | 9/1995 |
| JP | 2002-189067 A | 7/2002 |
| JP | 2004-282054 A | 10/2004 |
| JP | 2014-240847 A | 12/2014 |

* cited by examiner

BEFORE PULLING

| ELEMENT PORTION | RESISTANCE R | Vout1 | Vout2 | Voff |
|---|---|---|---|---|
| E1 | 3 | | | |
| E2 | 3 | 0.5 | | |
| E4 | 3 | | | |
| E3 | 3 | | 0.5 | 0 |

AFTER PULLING

| ELEMENT PORTION | RESISTANCE R | Vout1 | Vout2 | Voff |
|---|---|---|---|---|
| E1 | 2 | | | |
| E2 | 2 | 0.5 | | |
| E4 | 4 | | | |
| E3 | 4 | | 0.5 | 0 |

FIG.9
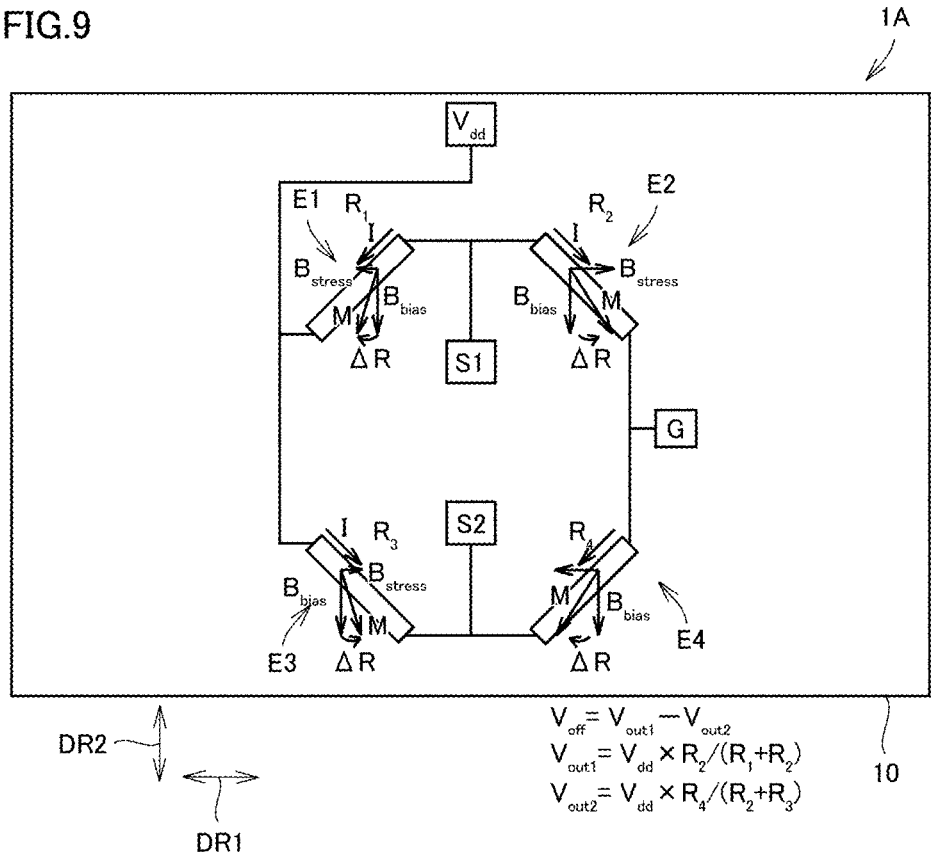
FIG.10
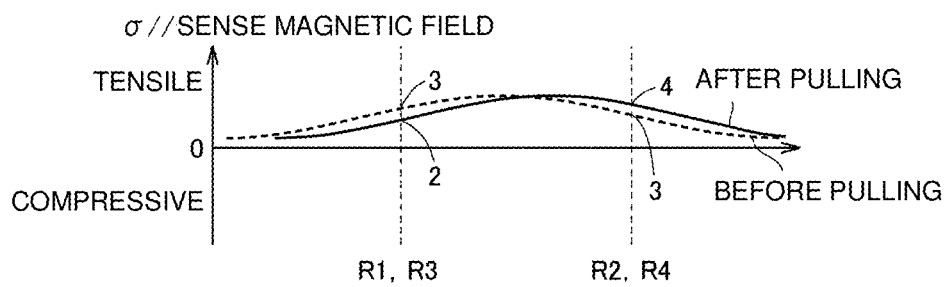
FIG.11
BEFORE PULLING
| ELEMENT PORTION | RESISTANCE R | Vout1 | Vout2 | Voff |
|---|---|---|---|---|
| E1 | 3 | | | |
| E2 | 3 | 0.5 | | |
| E4 | 3 | | | |
| E3 | 3 | | 0.5 | 0 |

FIG.12
AFTER PULLING
| ELEMENT PORTION | RESISTANCE R | Vout1 | Vout2 | Voff |
|---|---|---|---|---|
| E1 | 2 | | | |
| E2 | 4 | 0.667 | | |
| E4 | 4 | | | |
| E3 | 2 | | 0.667 | 0 |
FIG.13
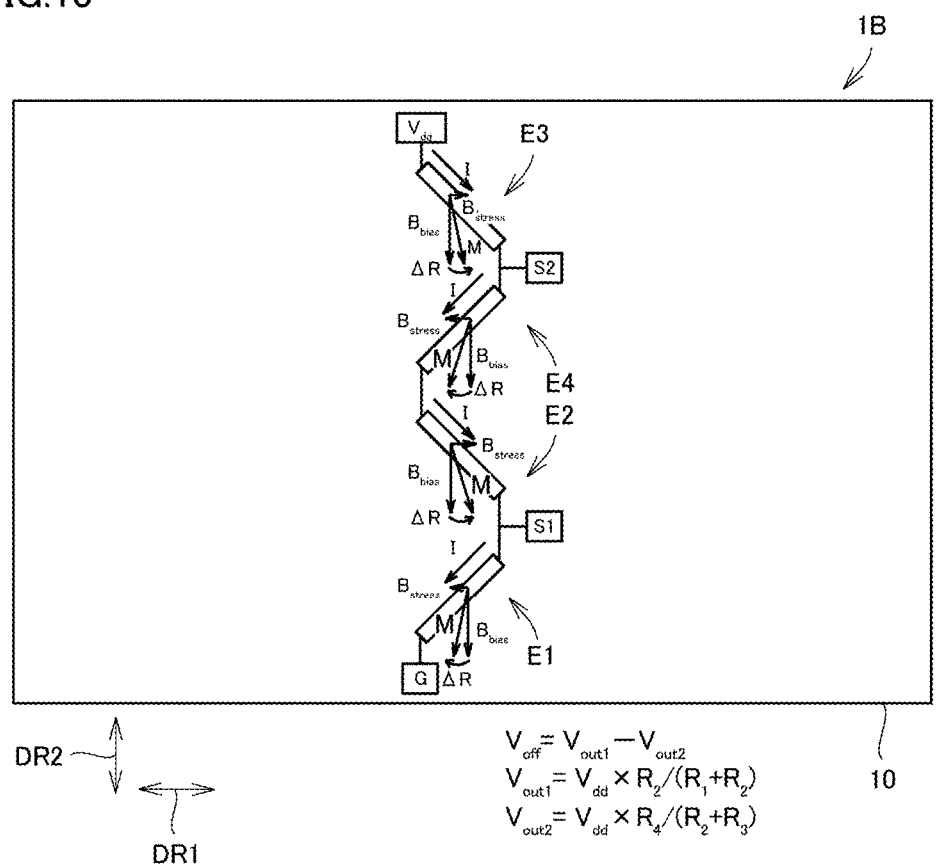
FIG.14
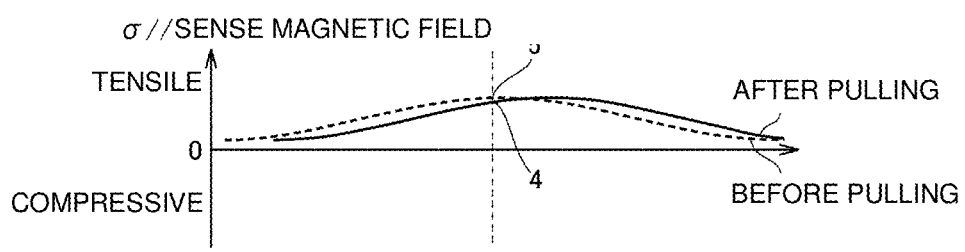

BEFORE PULLING

| ELEMENT PORTION | RESISTANCE R | Vout1 | Vout2 | Voff |
|---|---|---|---|---|
| E1 | 5 | | | |
| E2 | 5 | 0.5 | | |
| E4 | 5 | | | |
| E3 | 5 | | 0.5 | 0 |

AFTER PULLING

| ELEMENT PORTION | RESISTANCE R | Vout1 | Vout2 | Voff |
|---|---|---|---|---|
| E1 | 4 | | | |
| E2 | 4 | 0.5 | | |
| E4 | 4 | | | |
| E3 | 4 | | 0.5 | 0 |

FIG.18
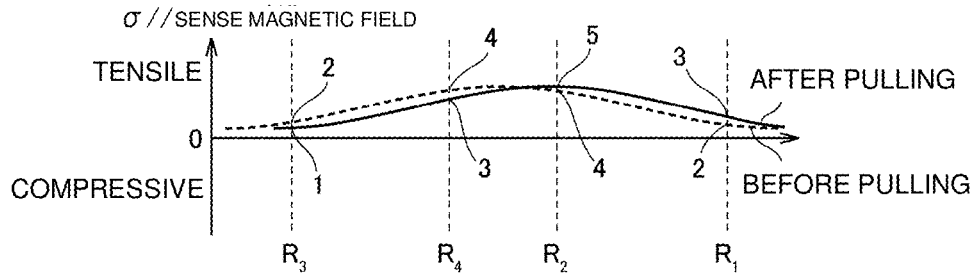
FIG.19
BEFORE PULLING
| ELEMENT PORTION | RESISTANCE R | Vout1 | Vout2 | Voff |
|---|---|---|---|---|
| E1 | 2 | | | |
| E2 | 4 | 0.667 | | |
| E4 | 4 | | | |
| E3 | 2 | | 0.667 | 0 |
FIG.20
AFTER PULLING
| ELEMENT PORTION | RESISTANCE R | Vout1 | Vout2 | Voff |
|---|---|---|---|---|
| E1 | 3 | | | |
| E2 | 5 | 0.625 | | |
| E4 | 3 | | | |
| E3 | 1 | | 0.75 | −0.125 |
FIG.21
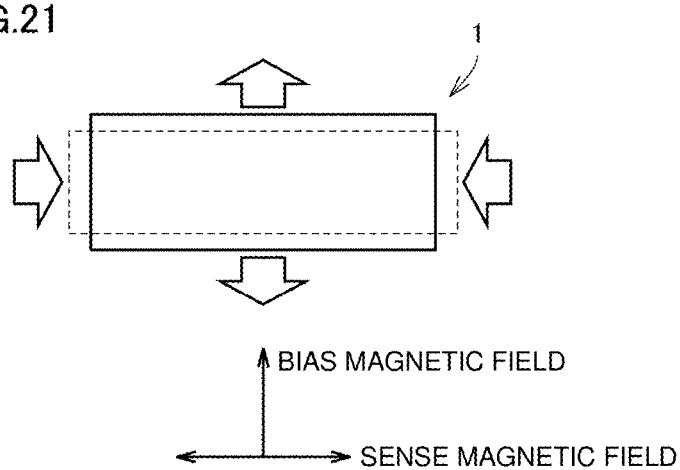

MAGNETIC SENSOR AND CURRENT SENSOR

CROSS REFERENCE TO RELATED APPLICATIONS

This application claims the benefit of priority to Japanese Patent Application No. 2018-010645 filed on Jan. 25, 2018 and is a Continuation Application of PCT Application No. PCT/JP2018/047564 filed on Dec. 25, 2018. The entire contents of each application are hereby incorporated herein by reference.

BACKGROUND OF THE INVENTION

1. Field of the Invention

The present disclosure relates to a magnetic sensor and a current sensor.

2. Description of the Related Art

Various types of methods for controlling magnetic anisotropy have been proposed to improve sensor characteristics and reliability in a magnetic sensor using the magneto-resistance effect. For example, Japanese Unexamined Patent Application Publication No. 7-244142 and Japanese Unexamined Patent Application Publication No. 2002-189067 disclose methods using stress-induced anisotropy derived from the inverse magneto-striction effect.

A magnetic sensor disclosed in Japanese Unexamined Patent Application Publication No. 7-244142 includes a sensor pattern, a direction of magnetization of which changes between an easy direction of magnetization and a hard direction of magnetization in accordance with the strength of a magnetic field and which uses a ferromagnetic metal thin film, and if the ferromagnetic metal thin film has a positive magneto-striction constant, a continuing tensile stress is applied in the hard direction of magnetization of the sensor pattern. On the other hand, if the ferromagnetic metal thin film has a negative magneto-striction constant, a continuing compressive stress is applied in the hard direction of magnetization of the sensor pattern. This allows increase in sensitivity in a micro magnetic field.

A magnetic sensor disclosed in Japanese Unexamined Patent Application Publication No. 2002-189067 is arranged on a piezoelectric substrate, and application of a voltage to the piezoelectric substrate puts a strain on the magnetic sensor. With the strain, internal anisotropy of a magnetic material, of which the magnetic sensor is made, changes to change sensor characteristics. As a result, an operating point can be set at a point where the magnetic sensor has high sensitivity.

However, in the magnetic sensor disclosed in Japanese Unexamined Patent Application Publication No. 7-244142, even if a continuing stress is applied, stress-induced magnetic anisotropy develops in a direction parallel to a magneto-sensitive direction when the stress varies due to, for example, an external input. This causes variation in a resistance value of the magnetic sensor in a zero magnetic field.

The magnetic sensor disclosed in Japanese Unexamined Patent Application Publication No. 2002-189067 is configured to use a piezoelectric element. The configuration is elaborate which results in increased manufacturing costs.

SUMMARY OF THE INVENTION

Preferred embodiments of the present invention provide magnetic sensors and current sensors that each provide an increase in reliability for stress variation.

A magnetic sensor according to a first preferred embodiment of the present invention includes a substrate, and a magneto-resistive element portion which is provided on the substrate and has a predetermined magneto-sensitive direction, and in which a bias magnetic field is applied in a direction orthogonal or substantially orthogonal to the magneto-sensitive direction. The magneto-resistive element portion includes a magnetic layer having a negative magneto-striction constant, and stress-induced anisotropy of the magnetic layer develops in a direction parallel or substantially parallel to the direction of the bias magnetic field in response to a tensile stress acting on the substrate in a direction parallel or substantially parallel to the magneto-sensitive direction.

A magnetic sensor according to a second preferred embodiment of the present invention includes a substrate, and a magneto-resistive element portion which is provided on the substrate and has a predetermined magneto-sensitive direction, and in which a bias magnetic field is applied in a direction orthogonal or substantially orthogonal to the magneto-sensitive direction. The magneto-resistive element includes a magnetic layer having a positive magneto-striction constant, and stress-induced anisotropy of the magnetic layer develops in a direction parallel or substantially parallel to the direction of the bias magnetic field in response to a compressive stress acting on the substrate in a direction parallel or substantially parallel to the magneto-sensitive direction.

In a magnetic sensors according to a preferred embodiment of the present invention, the substrate may have an elongated shape having a lengthwise direction. In this case, the magneto-sensitive direction may be parallel or substantially parallel to the lengthwise direction.

In a magnetic sensors according to a preferred embodiment of the present invention, the magneto-resistive element portion may include a first magneto-resistive element, a second magneto-resistive element, a third magneto-resistive element, and a fourth magneto-resistive element which are electrically series-connected side-by-side in a column along the direction parallel or substantially parallel to the direction of the bias magnetic field. In this case, a midpoint potential between the first magneto-resistive element and the second magneto-resistive element may be detected from a connecting portion which connects the first magneto-resistive element and the second magneto-resistive element and a midpoint potential between the third magneto-resistive element and the fourth magneto-resistive element may be detected from a connecting portion which connects the third magneto-resistive element and the fourth magneto-resistive element.

In a magnetic sensors according to a preferred embodiment of the present invention, the magneto-resistive element portion may include a first magneto-resistive element, a second magneto-resistive element, a third magneto-resistive element, and a fourth magneto-resistive element which are provided in a matrix. In this case, the first magneto-resistive element, the second magneto-resistive element, the third magneto-resistive element, and the fourth magneto-resistive element may define a full-bridge circuit.

In a magnetic sensors according to a preferred embodiment of the present invention, the first magneto-resistive element and the second magneto-resistive element may be provided side-by-side in a column along the direction parallel or substantially parallel to the direction of the bias magnetic field and define a first half-bridge circuit. The third magneto-resistive element and the fourth magneto-resistive element may be provided side-by-side in a column along the direction parallel or substantially parallel to the direction of the bias magnetic field and define a second half-bridge circuit. In this case, the first half-bridge circuit and the second half-bridge circuit may define the full-bridge circuit. A midpoint potential between the first magneto-resistive element and the second magneto-resistive element may be detected from a connecting portion which connects the first magneto-resistive element and the second magneto-resistive element and a midpoint potential between the third magneto-resistive element and the fourth magneto-resistive element may be detected from a connecting portion which connects the third magneto-resistive element and the fourth magneto-resistive element.

A current sensor according to a preferred embodiment of the present invention includes a busbar through which a current as a measurement object flows and a magnetic sensor according to a preferred embodiment of the present invention.

According to preferred embodiments of the present invention, it is possible to provide magnetic sensors and current sensors that each provide an increase in reliability for stress variation.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a diagram showing a pattern of a plurality of magneto-resistive elements defining a magneto-resistive element portion according to a second preferred embodiment of the present invention, and forces which act on each magneto-resistive element, a direction of magnetization of the magneto-resistive element, and the like when a magnetic sensor element is pulled.

FIG. 10 is a graph showing change in resistances of the plurality of magneto-resistive elements when the magnetic sensor element according to the second preferred embodiment of the present invention is pulled in a magneto-sensitive direction.

FIG. 11 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the second preferred embodiment of the present invention is pulled in the magneto-sensitive direction.

FIG. 12 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the second preferred embodiment of the present invention is pulled in the magneto-sensitive direction.

FIG. 13 is a diagram showing a pattern of a plurality of magneto-resistive elements defining a magneto-resistive element portion according to a third preferred embodiment of the present invention, and forces which act on each magneto-resistive element, a direction of magnetization of the magneto-resistive element, and the like when a magneto-resistive element is pulled.

FIG. 14 is a graph showing change in resistances of the plurality of magneto-resistive elements when the magnetic sensor element according to the third preferred embodiment of the present invention is pulled in a magneto-sensitive direction.

FIG. 18 is a graph showing change in resistances of the plurality of magneto-resistive elements when the magnetic sensor element according to the comparative example is pulled in a magneto-sensitive direction.

FIG. 19 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the comparative example is pulled in the magneto-sensitive direction.

FIG. 20 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the comparative example is pulled in the magneto-sensitive direction.

FIG. 21 is a diagram showing forces which act when a magnetic sensor element according to a modification is compressed in a magneto-sensitive direction.

DETAILED DESCRIPTION OF THE PREFERRED EMBODIMENTS

Figure 1:
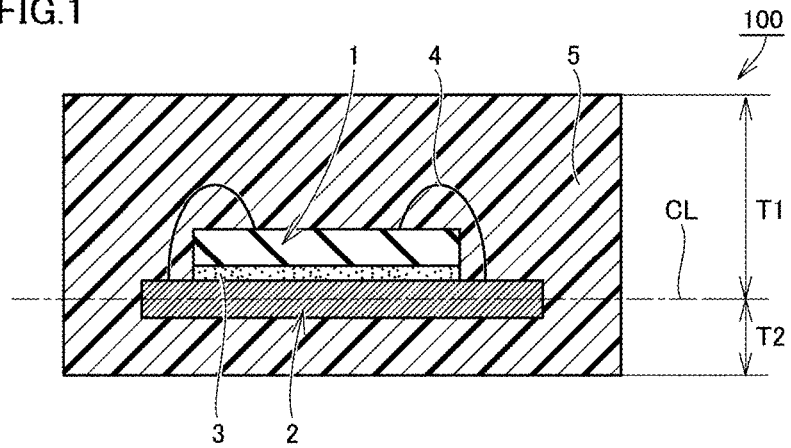
FIG. 1 is a sectional view showing a magnetic sensor according to a first preferred embodiment of the present invention.

Preferred embodiments of the present disclosure will be described below in detail with reference to the drawings. Note that the same or common portions in the preferred embodiments to be described below are denoted by the same reference characters in the drawings and that a description thereof will not be repeated.

First Preferred Embodiment

FIG. 1 is a sectional view showing a magnetic sensor according to a first preferred embodiment of the present invention. A magnetic sensor 100 according to the first preferred embodiment will be described with reference to FIG. 1.

As shown in FIG. 1, the magnetic sensor 100 according to the first preferred embodiment includes a magnetic sensor element 1, a lead frame 2, a joining member 3, bonding wires 4, and a sealing member 5. The magnetic sensor element 1 is sealed with the sealing member 5 in a state where the magnetic sensor element 1 is joined to the lead frame 2 by the joining member 3. The magnetic sensor element 1 is electrically connected to the lead frame 2 by the bonding wires 4.

Assume that a direction parallel or substantially parallel to a direction in which the lead frame 2, the joining member 3, and the magnetic sensor element 1 are provided side-by-side is a thickness direction. A thickness T1 of the sealing member 5 on a side where the joining member 3 and the magnetic sensor element 1 are located with respect to a center line CL of the lead frame 2 passing through a center or approximate center of the lead frame 2 in the thickness direction is larger than a thickness of the sealing member 5 on a side opposite to the side where the joining member 3 and the magnetic sensor element 1 are located.

Figure 2:
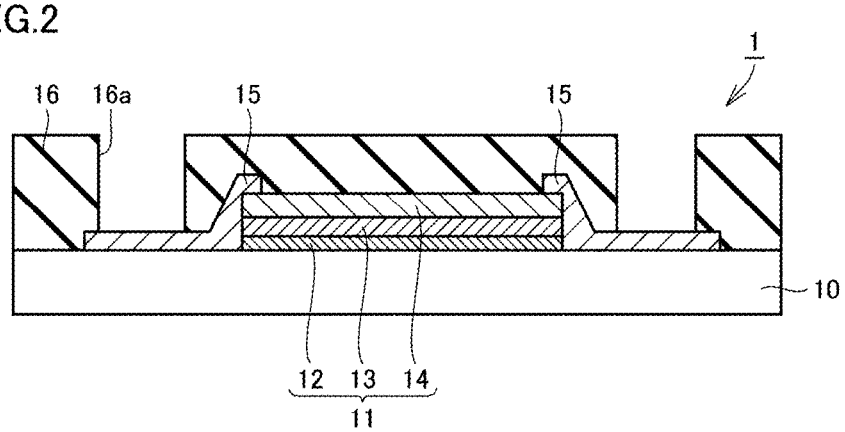
FIG. 2 is a sectional view showing a magnetic sensor element according to the first preferred embodiment of the present invention.

FIG. 2 is a sectional view showing a magnetic sensor element according to the first preferred embodiment. The magnetic sensor element 1 according to the first preferred embodiment will be described with reference to FIG. 2.

As shown in FIG. 2, the magnetic sensor element 1 according to the first preferred embodiment is, for example, an AMR element. The magnetic sensor element 1 includes a substrate 10, a multilayer body 11 as a magneto-resistive element portion, one pair of electrode portions 15, and a protective layer 16.

The substrate 10 preferably includes, for example, an Si substrate with a thermal oxide film. Note that the substrate 10 may include an insulative substrate, for example, a glass substrate, or may include a plate-shaped member with an insulating film formed thereon.

The multilayer body 11 is provided on a principal surface of the substrate 10. The multilayer body 11 is formed in a desired pattern, as will be described later. The multilayer body 11 includes an underlying film 12, a magnetic film 13, and a protective film 14. The underlying film 12, the magnetic film 13, and the protective film 14 are stacked in order from the substrate 10.

The underlying film 12 is provided on the thermal oxide film with high insulation. A metal film made of a metal, for example, Ta, W, Mo, Ti, or Ru, or a multilayer film with such metal films stacked is used as the underlying film 12. The underlying film 12 is provided to appropriately grow the magnetic film 13. Note that if the magnetic film 13 is able to be appropriately grown without the underlying film 12, the underlying film 12 may be omitted.

The magnetic film 13 is provided on the underlying film 12. The magnetic film 13 has a negative magneto-striction constant $\lambda$. The magnetic film 13 is preferably structured such that the magneto-striction constant $\lambda$ satisfies about $-1$ ppm$<\lambda<$about 0 ppm, for example. The magnetic film 13 is preferably made of, for example, an alloy of Ni and Fe. In this case, the magneto-striction constant $\lambda$ of the magnetic film 13 is able to be appropriately set by adjusting Ni composition.

The protective film 14 is provided on the magnetic film 13. A metal film made of a metal, for example, Ta, W, Mo, Ti, or Ru, or a multilayer film with such metal films stacked is provided as the protective film 14. The protective film 14 is provided to protect the magnetic film 13. Note that the protective film 14 may be omitted if device characteristics are not affected.

One pair of electrode portions 15 is provided at both ends of the multilayer body 11. The electrode portions 15 are made of a metal material with good conductivity, for example, Al, Cu, or Au. To improve close contact between the multilayer body 11 and each electrode portion 15, a close-contact layer made of, for example, Ti or Cr may be provided between the multilayer body 11 and the electrode portion 15.

The protective layer 16 covers the multilayer body 11 and the one pair of electrode portions 15. Contact holes 16a are provided in the protective layer 16, and portions of the one pair of electrode portions 15 are exposed. One end side of each bonding wire 4 is inserted into the contact hole 16a, and the one end of the bonding wire 4 is connected to the electrode portion 15. The other end side of the bonding wire 4 is connected to the lead frame 2.

For the protective layer 16, a material with high insulation, for example, $SiO_2$, $TiO_2$, $ZrO_2$, $Al_2O_3$, or $HfO_2$, is preferably used. The protective layer 16 is provided in order to significantly reduce or prevent oxidizing or corroding of the multilayer body 11 or the like. Note that the protective layer 16 may be omitted.

Figure 3:
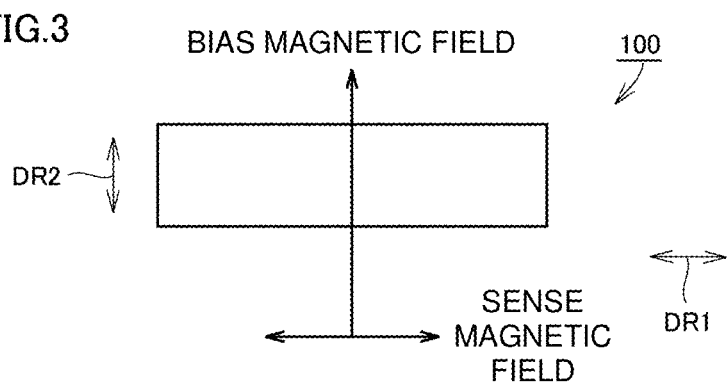
FIG. 3 is a diagram showing a relationship between a direction of a bias magnetic field applied to the magnetic sensor element and a magneto-sensitive direction in the magnetic sensor according to the first preferred embodiment of the present invention.

FIG. 3 is diagram showing a relationship between a direction of a bias magnetic field applied to the magnetic sensor element and a magneto-sensitive direction in the magnetic sensor according to the first preferred embodiment.

As shown in FIG. 3, the magnetic sensor 100 has an elongated shape with a lengthwise direction (a direction DR1) and a widthwise direction (a direction DR2) when seen in plan view. Similarly, the magnetic sensor element 1 has an elongated shape with a lengthwise direction (the direction DR1) and a widthwise direction (the direction DR2) when seen in plan view. The magnetic sensor element 1 has a magneto-sensitive direction in a direction parallel or substantially parallel to the lengthwise direction.

The magnetic sensor 100 includes a magnetic field application portion (not shown) to apply a bias magnetic field to the magnetic sensor element 1. The magnetic field application portion includes, for example, a permanent magnet (not shown). The permanent magnet, together with the magnetic sensor element 1, is sealed with the sealing member 5. The magnetic field application portion applies a bias magnetic field in a direction (the direction DR2) orthogonal or substantially orthogonal to the magneto-sensitive direction.

To manufacture the magnetic sensor 100, the substrate 10 is first prepared. The multilayer body 11 having the desired pattern is formed on the substrate 10, by photolithography, dry etching, or the like, for example.

Then, the one pair of electrode portions 15 is formed by photolithography, vapor deposition, sputtering, or the like, for example. Subsequently, the protective layer 16 is formed to cover the multilayer body 11 and the one pair of electrode portions 15, by sputtering, CVD, or the like, for example.

Next, the contact holes 16a are formed by photolithography, dry etching, or the like, for example. The substrate 10 is then cut into individual pieces of a predetermined size, by a dicing apparatus, to form the magnetic sensor elements 1.

Subsequently, each magnetic sensor element 1 is fixed to the lead frame 2 by the joining member 3. Then, the one pair of electrode portions 15 and the lead frame 2 are electrically connected by the bonding wires 4. In this state, the lead frame 2 and the magnetic sensor element 1, together with a permanent magnet to apply a bias magnetic field, are sealed with the sealing member 5. Accordingly, the magnetic sensor 100 is manufactured.

Note that the magnetic sensor element 1 is sealed, and a tensile stress (initial stress) acts on the magnetic sensor element 1 in a lengthwise direction parallel or substantially parallel to the lengthwise direction (the direction DR1) due to a difference in thermal expansion coefficient between the sealing member 5 and the magnetic sensor element 1. With this sealing, the above-described lengthwise direction, that is, a direction parallel or substantially parallel to the magneto-sensitive direction is predominant as each of a direction of the initial stress and a direction of stress variation based on usage conditions in a state of being subjected to an ambient temperature.

Figure 4:
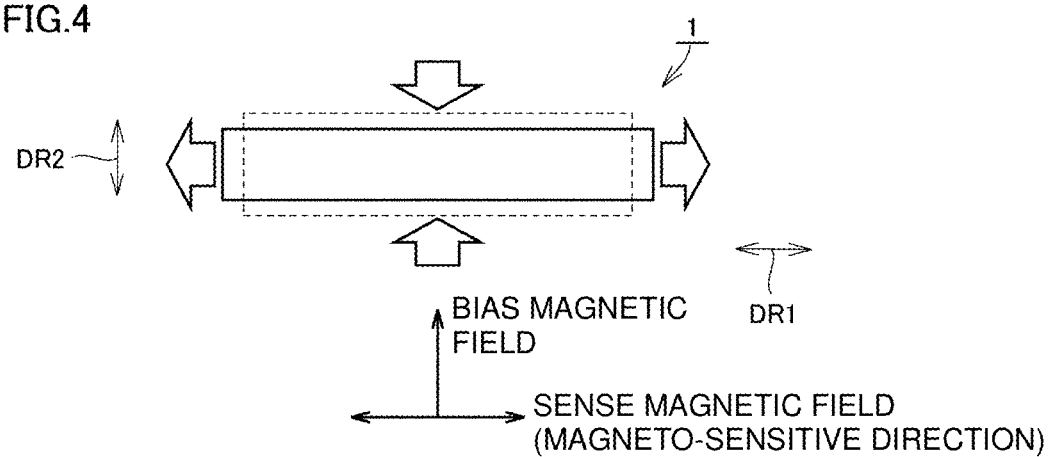
FIG. 4 is a diagram showing forces which act when the magnetic sensor element according to the first preferred embodiment of the present invention is pulled in the magneto-sensitive direction.

FIG. 4 is a diagram showing forces which act when the magnetic sensor element according to the first preferred embodiment is pulled in a magneto-sensitive direction. The forces that act when the magnetic sensor element according to the first preferred embodiment is pulled in the magneto-sensitive direction will be described with reference to FIG. 4.

As shown in FIG. 4, if the magnetic sensor element 1 is pulled in the direction parallel or substantially parallel to the magneto-sensitive direction, that is, a tensile stress acts on the magnetic sensor element 1 in the direction parallel or substantially parallel to the magneto-sensitive direction, both end sides of the magnetic sensor element 1 in the direction parallel or substantially parallel to the magneto-sensitive direction are pulled outward, and a central portion of the magnetic sensor element 1 in parallel or substantially parallel to the magneto-sensitive direction is compressed in the direction orthogonal or substantially orthogonal to the magneto-sensitive direction. Accordingly, if the magneto-resistive element portion is provided at the central portion of the magnetic sensor element 1, a direction of stress-induced anisotropy of the magnetic film 13 that develops due to the inverse magneto-striction effect is parallel or substantially parallel to the direction of the bias magnetic field.

Figure 5:
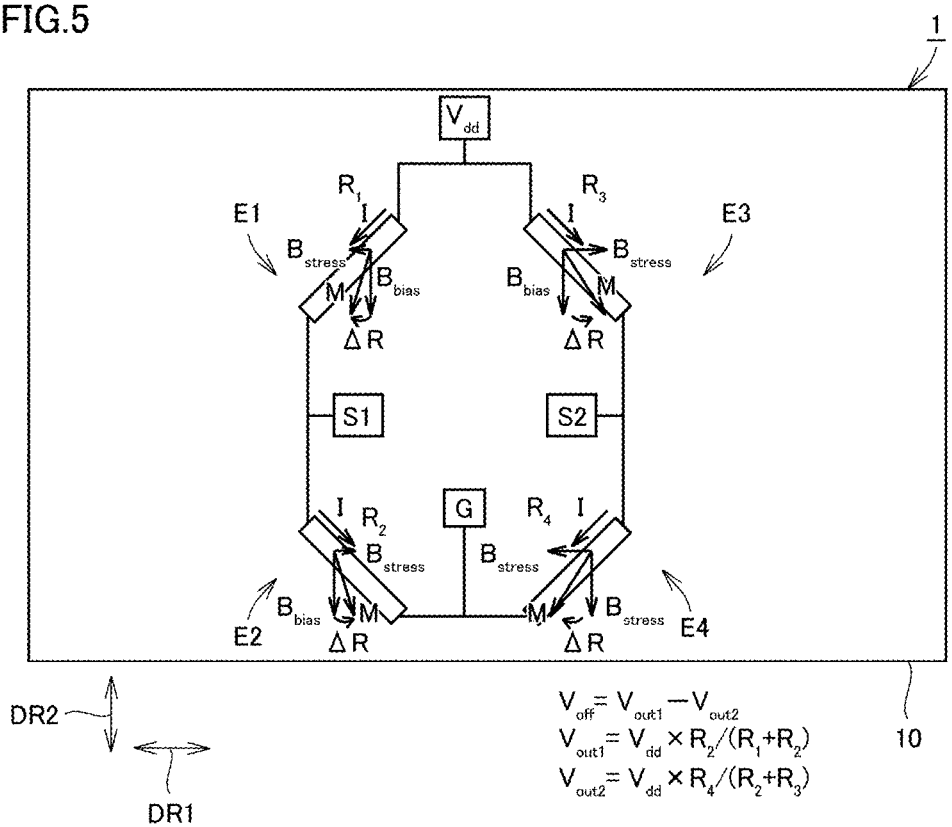
FIG. 5 is a diagram showing a pattern of a plurality of magneto-resistive elements defining a magneto-resistive element portion according to the first preferred embodiment of the present invention, and forces which act on each magneto-resistive element, a direction of magnetization of the magneto-resistive element, and the like when the magnetic sensor element is pulled.

FIG. 5 is a diagram showing a pattern of a plurality of magneto-resistive elements defining a magneto-resistive element according to the first preferred embodiment, and forces which act on each magneto-resistive element, a direction of magnetization of the magneto-resistive element, and the like when the magnetic sensor element is pulled.

As shown in FIG. 5, the magnetic sensor element 1 includes a first magneto-resistive element E1, a second magneto-resistive element E2, a third magneto-resistive element E3, and a fourth magneto-resistive element E4 which are provided in a matrix. The first magneto-resistive element E1, the second magneto-resistive element E2, the third magneto-resistive element E3, and the fourth magneto-resistive element E4 include the multilayer body 11 that is patterned in a desired shape. The first magneto-resistive element E1, the second magneto-resistive element E2, the third magneto-resistive element E3, and the fourth magneto-resistive element E4 are provided in two rows and in two columns and define a full-bridge circuit.

The first magneto-resistive element E1 and the third magneto-resistive element E3 are provided side-by-side in a row along a direction orthogonal or substantially orthogonal to the direction of the bias magnetic field. The second magneto-resistive element E2 and the fourth magneto-resistive element E4 are provided side-by-side in a row along the direction orthogonal or substantially orthogonal to the direction of the bias magnetic field.

The first magneto-resistive element E1 and the second magneto-resistive element E2 are provided side-by-side in a column along a direction parallel or substantially parallel to the direction of the bias magnetic field. The third magneto-resistive element E3 and the fourth magneto-resistive element E4 are provided side-by-side in a column along the direction parallel or substantially parallel to the direction of the bias magnetic field.

The first magneto-resistive element E1 and the second magneto-resistive element E2 define a first half-bridge circuit. The third magneto-resistive element E3 and the fourth magneto-resistive element E4 define a second half-bridge circuit. The first half-bridge circuit and the second half-bridge circuit define the full-bridge circuit.

One end side of the first magneto-resistive element E1 is electrically connected to an electrode pad Vdd to apply a voltage in accordance with a wiring pattern. The other end side of the first magneto-resistive element E1 is connected to one end side of the second magneto-resistive element E2 and is electrically connected to an electrode pad S1 to detect a midpoint potential Vout1 between the first magneto-resistive element E1 and the second magneto-resistive element E2, in accordance with the wiring pattern.

The one end side of the second magneto-resistive element E2 is connected to the other end side of the first magneto-resistive element E1 and is electrically connected to the electrode pad S1, in accordance with the wiring pattern. The other end side of the second magneto-resistive element E2 is electrically connected to an electrode pad G which is connected to ground in accordance with the wiring pattern.

One end side of the third magneto-resistive element E3 is electrically connected to the electrode pad Vdd in accordance with the wiring pattern. The other end side of the third magneto-resistive element E3 is connected to one end side of the fourth magneto-resistive element E4 and is electrically connected to an electrode pad S2 to detect a midpoint potential Vout2 between the third magneto-resistive element E3 and the fourth magneto-resistive element E4, in accordance with the wiring pattern.

The one end side of the fourth magneto-resistive element E4 is connected to the other end side of the third magneto-resistive element E3 and is electrically connected to the electrode pad S2, in accordance with the wiring pattern. The other end side of the fourth magneto-resistive element E4 is electrically connected to the electrode pad G, in accordance with the wiring pattern.

When a voltage is applied between the electrode pad Vdd and the electrode pad G, the midpoint potential Vout1 and the midpoint potential Vout2 are extracted from the electrode pad S1 and the electrode pad S2 in accordance with magnetic field strength.

Letting R1 be a resistance of the first magneto-resistive element E1, R2 be a resistance of the second magneto-resistive element E2, R3 be a resistance of the third magneto-resistive element E3, and R4 be a resistance of the fourth magneto-resistive element E4, the midpoint potential Vout1 and the midpoint potential Vout2 are expressed by Expressions (1) and (2) below. Note that values of R1, R2, R3, and R4 described above vary in accordance with a tensile stress applied to the magnetic sensor element 1.

$$\text{Midpoint potential Vout1} = Vdd \times R2/(R1+R2) \quad (1)$$

$$\text{Midpoint potential Vout2} = Vdd \times R4/(R3+R4) \quad (2)$$

In a case where the magnetic sensor element 1 is pulled in the magneto-sensitive direction, a stress Bstress acts on each of the first magneto-resistive element E1, the second magneto-resistive element E2, the third magneto-resistive element E3, and the fourth magneto-resistive element E4 in the direction parallel or substantially parallel to the direction of the bias magnetic field, as shown in FIG. 5. With this action, a direction of magnetization M of a magnetic body changes from a direction parallel or substantially parallel to a bias magnetic field Bbias to a direction which is the resultant of the bias magnetic field Bbias and the stress Bstress. This results in a change of the resistance of each of the first magneto-resistive element E1, the second magneto-resistive element E2, the third magneto-resistive element E3, and the fourth magneto-resistive element E4.

Figures 6, 7, 8:
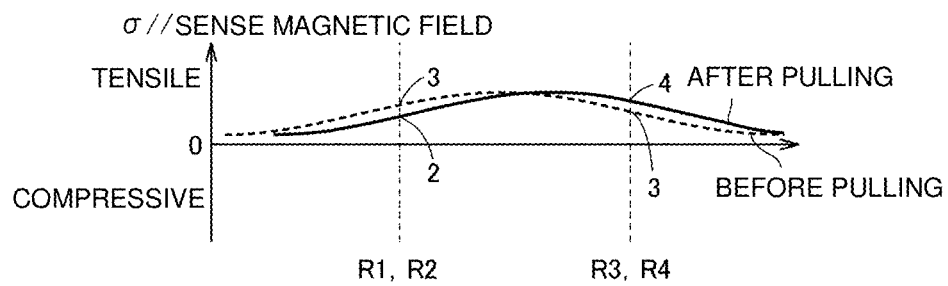
FIG. 6 is a graph showing change in resistances of the plurality of magneto-resistive elements when the magnetic sensor element according to the first preferred embodiment of the present invention is pulled in the magneto-sensitive direction.
FIG. 7 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the first preferred embodiment of the present invention is pulled in the magneto-sensitive direction.
FIG. 8 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the first preferred embodiment of the present invention is pulled in the magneto-sensitive direction.

FIG. 6 is a graph showing change in resistances of the plurality of magneto-resistive elements when the magnetic sensor element according to the first preferred embodiment is pulled in the magneto-sensitive direction. Note that, in FIG. 6, a force which acts on the magnetic sensor element before the pulling is indicated by a broken line, a force which acts on the magnetic sensor element after the pulling is indicated by a solid line, and the resistance of each magneto-resistive element before and after the pulling is expressed as a numerical value (relative ratio).

As shown in FIG. 6, before the magnetic sensor element is pulled in the magneto-sensitive direction, a stress distribution in the direction (widthwise direction) parallel or substantially parallel to the magneto-sensitive direction has a convex shape raised at the central portion in the widthwise direction due to the initial stress. In this case, the first magneto-resistive element E1 and the second magneto-resistive element E2, and the third magneto-resistive element E3 and the fourth magneto-resistive element E4 are located equidistant from the central portion in the widthwise direction along the widthwise direction. Accordingly, the resistances of the first magneto-resistive element E1, the second magneto-resistive element E2, the third magneto-resistive element E3, and the fourth magneto-resistive element E4 are equal or substantially equal. In this case, the resistance R1 of the first magneto-resistive element E1, the resistance R2 of the second magneto-resistive element E2, the resistance R3 of the third magneto-resistive element E3, and the resistance R4 of the fourth magneto-resistive element E4 are assumed to be 3.

After the magnetic sensor element 1 in an initial state is pulled in the magneto-sensitive direction, that is, a tensile stress acts on the substrate 10 in the direction parallel or substantially parallel to the magneto-sensitive direction, the stress Bstress acts on each magneto-resistive element. Thus, the resistances of the first magneto-resistive element E1, the second magneto-resistive element E2, the third magneto-resistive element E3, and the fourth magneto-resistive element E4 change from those before the magnetic sensor element 1 is pulled in the magneto-sensitive direction.

More specifically, the resistance R1 of the first magneto-resistive element E1 and the resistance R2 of the second magneto-resistive element E2 change from 3 to 2. The resistance R3 of the third magneto-resistive element E3 and the resistance R4 of the fourth magneto-resistive element E4 change from 3 to 4.

If the magnetic sensor element 1 is pulled in the magneto-sensitive direction, the central portion of the magnetic sensor element 1 in parallel or substantially parallel to the magneto-sensitive direction is compressed in the direction orthogonal or substantially orthogonal to the magneto-sensitive direction. Accordingly, if the magneto-resistive element portion is provided at the central portion of the magnetic sensor element 1, the direction of the stress-induced anisotropy of the magnetic film 13 that develops due to the inverse magneto-striction effect is parallel or substantially parallel to the direction of the bias magnetic field, as described above. This reduces or prevents variation in the resistances of the first magneto-resistive element E1, the second magneto-resistive element E2, the third magneto-resistive element E3, and the fourth magneto-resistive element E4 that arises from the stress-induced anisotropy.

FIG. 7 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the first preferred embodiment is pulled in the magneto-sensitive direction.

As shown in FIG. 7, before the magnetic sensor element 1 is pulled in the magneto-sensitive direction, the resistance R1 of the first magneto-resistive element E1 and the resistance R2 of the second magneto-resistive element E2 have identical values, and the resistance R3 of the third magneto-resistive element E3 and the resistance R4 of the fourth magneto-resistive element E4 have identical values, as described above. Accordingly, the midpoint potential Vout1 and the midpoint potential Vout2 calculated from Expressions (1) and (2) described above have values identical to each other. More specifically, the midpoint potential Vout1 and the midpoint potential Vout2 are about 0.5. As a result, a difference Voff which is a difference between the midpoint potential Vout1 and the midpoint potential Vout2 is about 0.

FIG. 8 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the first preferred embodiment is pulled in the magneto-sensitive direction.

As shown in FIG. 8, even after the magnetic sensor element 1 is pulled in the magneto-sensitive direction, the resistance R1 of the first magneto-resistive element E1 and the resistance R2 of the second magneto-resistive element E2 have the same or substantially the same values, and the resistance R3 of the third magneto-resistive element E3 and the resistance R4 of the fourth magneto-resistive element E4 have the same or substantially the same values, as described above. Accordingly, the midpoint potential Vout1 and the midpoint potential Vout2 calculated from Expressions (1) and (2) described above have values to same or substantially the same as each other. More specifically, the midpoint potential Vout1 and the midpoint potential Vout2 are about 0.5. As a result, the difference Voff that is the difference between the midpoint potential Vout1 and the midpoint potential Vout2 is about 0.

Consequently, the magnetic sensor according to the first preferred embodiment is able to reduce or prevent Voff that is the difference between the midpoint potential Vout1 and the midpoint potential Vout2 from changing between before and after pulling.

As described above, the magnetic sensor 100 according to the first preferred embodiment includes a magneto-resistive element which is provided on a substrate and has a predetermined magneto-sensitive direction, and in which a bias magnetic field is applied in a direction orthogonal or substantially orthogonal to the magneto-sensitive direction, the magneto-resistive element includes a magnetic film having a negative magneto-striction constant, and stress-induced anisotropy of the magnetic film develops in a direction parallel or substantially parallel to the direction of the bias magnetic field in response to a tensile stress acting on the substrate in a direction parallel or substantially parallel to the magneto-sensitive direction.

As a result, as described above, it is possible to reduce or prevent variation in the resistances of the first magneto-resistive element E1, the second magneto-resistive element E2, the third magneto-resistive element E3, and the fourth magneto-resistive element E4 that arises from stress-induced anisotropy. This provides the magnetic sensor 100 with improved reliability for stress variation.

Especially if the multilayer body 11 as the magneto-resistive element portion includes the first magneto-resistive element E1, the second magneto-resistive element E2, the third magneto-resistive element E3, and the fourth magneto-resistive element E4 that are provided in a matrix, and the first magneto-resistive element E1, the second magneto-resistive element E2, the third magneto-resistive element E3, and the fourth magneto-resistive element E4 define a full-bridge circuit, as described above, Voff is able to be suitably reduced or prevented from changing between before and after pulling.

Additionally, in the magnetic sensor 100, the first magneto-resistive element E1 and the second magneto-resistive element E2 are provided side-by-side in a column along the direction parallel or substantially parallel to the direction of the bias magnetic field and define the first half-bridge circuit, the third magneto-resistive element E3 and the fourth magneto-resistive element E4 are provided side-by-side in a column along the direction parallel or substantially parallel to the direction of the bias magnetic field and define the second half-bridge circuit, the first half-bridge circuit and the second half-bridge circuit define the full-bridge circuit described above, the midpoint potential between the first magneto-resistive element E1 and the second magneto-resistive element E2 is detected from a connecting portion which connects the first magneto-resistive element E1 and the second magneto-resistive element E2, and the midpoint potential between the third magneto-resistive element E3 and the fourth magneto-resistive element E4 is detected from a connecting portion which connects the third magneto-resistive element E3 and the fourth magneto-resistive element E4.

For the above-described reason, it is possible to reduce or prevent variation in the midpoint potential Vout1 and variation in the midpoint potential Vout2 between before and after pulling, as described above.

Second Preferred Embodiment

FIG. 9 is a diagram showing a pattern of a plurality of magneto-resistive elements defining a magneto-resistive element according to a second preferred embodiment of the present invention, and forces which act on each magneto-resistive element, a direction of magnetization of the magneto-resistive element, and the like when a magnetic sensor element is pulled. A magnetic sensor according to the second preferred embodiment will be described with reference to FIG. 9.

As shown in FIG. 9, the magnetic sensor according to the second preferred embodiment is different mainly in an arrangement pattern for a plurality of magneto-resistive elements defining a magneto-resistive element portion from the magnetic sensor 100 according to the first preferred embodiment. Other components are the same or similar.

A magnetic sensor element 1A includes a first magneto-resistive element E1, a second magneto-resistive element E2, a third magneto-resistive element E3, and a fourth magneto-resistive element E4 which are provided in a matrix. The first magneto-resistive element E1, the second magneto-resistive element E2, the third magneto-resistive element E3, and the fourth magneto-resistive element E4 are provided in two rows and in two columns and define a full-bridge circuit.

The first magneto-resistive element E1 and the third magneto-resistive element E3 are provided side-by-side in a column along a direction parallel or substantially parallel to a direction of a bias magnetic field. The second magneto-resistive element E2 and the fourth magneto-resistive element E4 are provided side-by-side in a column along the direction parallel or substantially parallel to the direction of the bias magnetic field.

The first magneto-resistive element E1 and the second magneto-resistive element E2 are provided side-by-side in a row along a direction orthogonal or substantially orthogonal to the direction of the bias magnetic field. The third magneto-resistive element E3 and the fourth magneto-resistive element E4 are provided side-by-side in a row along the direction orthogonal or substantially orthogonal to the direction of the bias magnetic field.

The first magneto-resistive element E1 and the second magneto-resistive element E2 define a first half-bridge circuit. The third magneto-resistive element E3 and the fourth magneto-resistive element E4 define a second half-bridge circuit. The first half-bridge circuit and the second half-bridge circuit define the full-bridge circuit.

When a voltage is applied between an electrode pad Vdd and an electrode pad G, a midpoint potential Vout1 and a midpoint potential Vout2 are extracted from an electrode pad S1 and an electrode pad S2 in accordance with magnetic field strength.

In this case as well, the midpoint potential Vout1 and the midpoint potential Vout2 are expressed by Expressions (1) and (2) described above, as in the first preferred embodiment.

FIG. 10 is a graph showing change in resistances of the plurality of magneto-resistive elements when the magnetic sensor element according to the second preferred embodiment is pulled in a magneto-sensitive direction. Note that, in FIG. 10, a force which acts on the magnetic sensor element before the pulling is indicated by a broken line, a force which acts on the magnetic sensor element after the pulling is indicated by a solid line, and the resistance of each magneto-resistive element before and after the pulling is expressed as a numerical value (relative ratio).

As shown in FIG. 10, before the magnetic sensor element 1A is pulled in the magneto-sensitive direction, a stress distribution in the direction (widthwise direction) parallel or substantially parallel to the magneto-sensitive direction has a convex shape raised at a central portion in the widthwise direction due to initial stress. In this case, the first magneto-resistive element E1 and the second magneto-resistive element E2, and the third magneto-resistive element E3 and the fourth magneto-resistive element E4 are located equidistant from the central portion in the widthwise direction along the widthwise direction. Accordingly, resistances of the first magneto-resistive element E1, the second magneto-resistive element E2, the third magneto-resistive element E3, and the fourth magneto-resistive element E4 are equal or substantially equal. In this case, a resistance R1 of the first magneto-resistive element E1, a resistance R2 of the second magneto-resistive element E2, a resistance R3 of the third magneto-resistive element E3, and a resistance R4 of the fourth magneto-resistive element E4 are assumed to be 3.

After the magnetic sensor element 1A is pulled in the magneto-sensitive direction, that is, a tensile stress acts on a substrate 10 in the direction parallel or substantially parallel to the magneto-sensitive direction, a stress Bstress acts on each magneto-resistive element. Thus, the resistances of the first magneto-resistive element E1, the second magneto-resistive element E2, the third magneto-resistive element E3, and the fourth magneto-resistive element E4 change from those before the magnetic sensor element 1A is pulled in the magneto-sensitive direction.

More specifically, the resistance R1 of the first magneto-resistive element E1 changes from 3 to 2. The resistance R2 of the second magneto-resistive element E2 changes from 3 to 4. The resistance R3 of the third magneto-resistive element E3 changes from 3 to 4. The resistance R4 of the fourth magneto-resistive element E4 changes from 3 to 2.

If the magnetic sensor element 1A is pulled in the magneto-sensitive direction, the central portion of the magnetic sensor element 1 in parallel or substantially parallel to the magneto-sensitive direction is compressed in a direction orthogonal or substantially orthogonal to the magneto-sensitive direction. Accordingly, if the magneto-resistive element portion is provided at the central portion of the magnetic sensor element 1A, a direction of stress-induced anisotropy of a magnetic film 13 that develops due to the inverse magneto-striction effect is parallel or substantially parallel to the direction of the bias magnetic field, as described above. This reduces or prevents variation in the resistances of the first magneto-resistive element E1, the second magneto-resistive element E2, the third magneto-resistive element E3, and the fourth magneto-resistive element E4 that arises from the stress-induced anisotropy.

FIG. 11 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the second preferred embodiment is pulled in the magneto-sensitive direction.

As shown in FIG. 11, before the magnetic sensor element 1A is pulled in the magneto-sensitive direction, the resistance R1 of the first magneto-resistive element E1 and the resistance R2 of the second magneto-resistive element E2 have the same or substantially the same values, and the resistance R3 of the third magneto-resistive element E3 and the resistance R4 of the fourth magneto-resistive element E4 have the same or substantially the same values, as described above. Accordingly, the midpoint potential Vout1 and the midpoint potential Vout2 calculated from Expressions (1) and (2) described above have values the same or substantially the same as each other. More specifically, the midpoint potential Vout1 and the midpoint potential Vout2 are about 0.5. A difference Voff which is a difference between the midpoint potential Vout1 and the midpoint potential Vout2 is about 0.

FIG. 12 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the second preferred embodiment is pulled in the magneto-sensitive direction.

As shown in FIG. 12, after the magnetic sensor element 1A according to second preferred embodiment is pulled in the magneto-sensitive direction, the resistance R1 of the first magneto-resistive element E1 and the resistance R2 of the second magneto-resistive element E2 have different values, as described above. The resistance R3 of the third magneto-resistive element E3 and the resistance R4 of the fourth magneto-resistive element E4 have different values. Accordingly, the midpoint potential Vout1 calculated from Expression (1) described above has different values before and after the pulling. Similarly, the midpoint potential Vout2 calculated from Expression (2) described above has different values before and after the pulling. More specifically, the midpoint potential Vout1 and the midpoint potential Vout2 are about 0.667.

Change in the resistance R1 of the first magneto-resistive element E1 and change in the resistance R3 of the third magneto-resistive element E3 between before and after the pulling are the same or similar, and change in the resistance R2 of the second magneto-resistive element E2 and change in the resistance R4 of the fourth magneto-resistive element E4 between before and after the pulling are the same or similar. Accordingly, a value of the midpoint potential Vout1 and a value of the midpoint potential Vout2 after the pulling are the same or similar. The difference Voff that is a difference between the midpoint potential Vout1 and the midpoint potential Vout2 is thus about 0. As a result, the magnetic sensor according to the second preferred embodiment is able to reduce or prevent Voff that is the difference between the midpoint potential Vout1 and the midpoint potential Vout2 from changing between before and after pulling.

In the magnetic sensor according to the second preferred embodiment as well, when a tensile stress acts on the substrate 10 in the direction parallel or substantially parallel to the magneto-sensitive direction, the stress-induced anisotropy of the magnetic film 13 develops in the direction parallel or substantially parallel to the direction of the bias magnetic field. This improves reliability for stress variation.

Third Preferred Embodiment

FIG. 13 is a diagram showing a pattern of a plurality of magneto-resistive elements defining a magneto-resistive element portion according to a third preferred embodiment of the present invention, and forces which act on each magneto-resistive element, a direction of magnetization of the magneto-resistive element, and the like when a magneto-resistive element is pulled. A magneto-resistive element according to the third preferred embodiment will be described with reference to FIG. 13.

As shown in FIG. 13, the magnetic sensor according to the third preferred embodiment is different mainly in an arrangement pattern for a plurality of magneto-resistive elements defining a magneto-resistive element portion from the magnetic sensor 100 according to the first preferred embodiment. Other components are the same or similar.

A magnetic sensor element 1B includes a first magneto-resistive element E1, a second magneto-resistive element E2, a third magneto-resistive element E3, and a fourth magneto-resistive element E4 which are provided in a column. The first magneto-resistive element E1, the second magneto-resistive element E2, the third magneto-resistive element E3, and the fourth magneto-resistive element E4 are provided side-by-side in the order of the third magneto-resistive element E3, the fourth magneto-resistive element E4, the second magneto-resistive element E2, the first magneto-resistive element E1 along a direction parallel or substantially parallel to a direction of a bias magnetic field and are electrically series-connected in the order.

One end side of the third magneto-resistive element E3 is electrically connected to an electrode pad Vdd in accordance with a wiring pattern. The other end side of the third magneto-resistive element E3 is electrically connected to one end side of the fourth magneto-resistive element E4 and is electrically connected to an electrode pad S2, in accordance with the wiring pattern.

The one end side of the fourth magneto-resistive element E4 is connected to the other end side of the third magneto-resistive element E3 and is electrically connected to the electrode pad S2, in accordance with the wiring pattern. The other end side of the fourth magneto-resistive element E4 is electrically connected to one end side of the second magneto-resistive element E2 in accordance with the wiring pattern.

The one end side of the second magneto-resistive element E2 is electrically connected to the other end side of the fourth magneto-resistive element E4 in accordance with the wiring pattern. The other end side of the second magneto-resistive element E2 is electrically connected to one end side of the first magneto-resistive element E1 and is electrically connected to an electrode pad S1, in accordance with the wiring pattern.

The one end side of the first magneto-resistive element E1 is electrically connected to the other end side of the second magneto-resistive element E2 and is electrically connected to the electrode pad S1, in accordance with the wiring pattern. The other end side of the first magneto-resistive element E1 is electrically connected to an electrode pad G.

When a voltage is applied between the electrode pad Vdd and the electrode pad G, a midpoint potential Vout1 and a midpoint potential Vout2 are extracted from the electrode pad S1 and the electrode pad S2 in accordance with magnetic field strength.

In this case as well, the midpoint potential Vout1 and the midpoint potential Vout2 are expressed by Expressions (1) and (2) described above, as in the first preferred embodiment.

FIG. 14 is a graph showing change in resistances of the plurality of magneto-resistive elements when the magnetic sensor element according to the third preferred embodiment is pulled in a magneto-sensitive direction. Note that, in FIG. 14, a force which acts on the magneto-resistive elements before the pulling is indicated by a broken line, a force which acts on the magneto-resistive elements after the pulling is indicated by a solid line, and the resistance of each magneto-resistive element before and after the pulling is expressed as a numerical value (relative ratio).

As shown in FIG. 14, before the magnetic sensor element 1B is pulled in the magneto-sensitive direction, a stress distribution in a direction (widthwise direction) parallel or substantially parallel to the magneto-sensitive direction has a convex shape raised at a central portion in the widthwise direction due to initial stress. In this case, the first magneto-resistive element E1 and the second magneto-resistive element E2, and the third magneto-resistive element E3 and the fourth magneto-resistive element E4 are located at the central portion in the widthwise direction. Accordingly, resistances of the first magneto-resistive element E1, the second magneto-resistive element E2, the third magneto-resistive element E3, and the fourth magneto-resistive element E4 are equal or substantially equal. In this case, a resistance R1 of the first magneto-resistive element E1, a resistance R2 of the second magneto-resistive element E2, a resistance R3 of the third magneto-resistive element E3, and a resistance R4 of the fourth magneto-resistive element E4 are assumed to be 5.

After the magnetic sensor element 1B is pulled in the magneto-sensitive direction, that is, a tensile stress acts on a substrate 10 in the direction parallel or substantially parallel to the magneto-sensitive direction, a stress Bstress acts on each magneto-resistive element. Thus, the resistances of the first magneto-resistive element E1, the second magneto-resistive element E2, the third magneto-resistive element E3, and the fourth magneto-resistive element E4 change from those before the magnetic sensor element 1 is pulled in the magneto-sensitive direction.

More specifically, the resistance R1 of the first magneto-resistive element E1, the resistance R2 of the second magneto-resistive element E2, the resistance R3 of the third magneto-resistive element E3, and the resistance R4 of the fourth magneto-resistive element E4 change from 5 to 4.

If the magnetic sensor element 1B is pulled in the magneto-sensitive direction, the central portion of the magnetic sensor element 1B in parallel or substantially parallel to the magneto-sensitive direction is compressed in a direction orthogonal or substantially orthogonal to the magneto-sensitive direction. Accordingly, if the magneto-resistive element portion is provided at the central portion of the magnetic sensor element 1B, a direction of stress-induced anisotropy of a magnetic film 13 that develops due to the inverse magneto-striction effect is parallel or substantially parallel to the direction of the bias magnetic field, as described above. This reduces or prevents variation in the resistances of the first magneto-resistive element E1, the second magneto-resistive element E2, the third magneto-resistive element E3, and the fourth magneto-resistive element E4 that arises from the stress-induced anisotropy.

Figures 15, 16, 17:
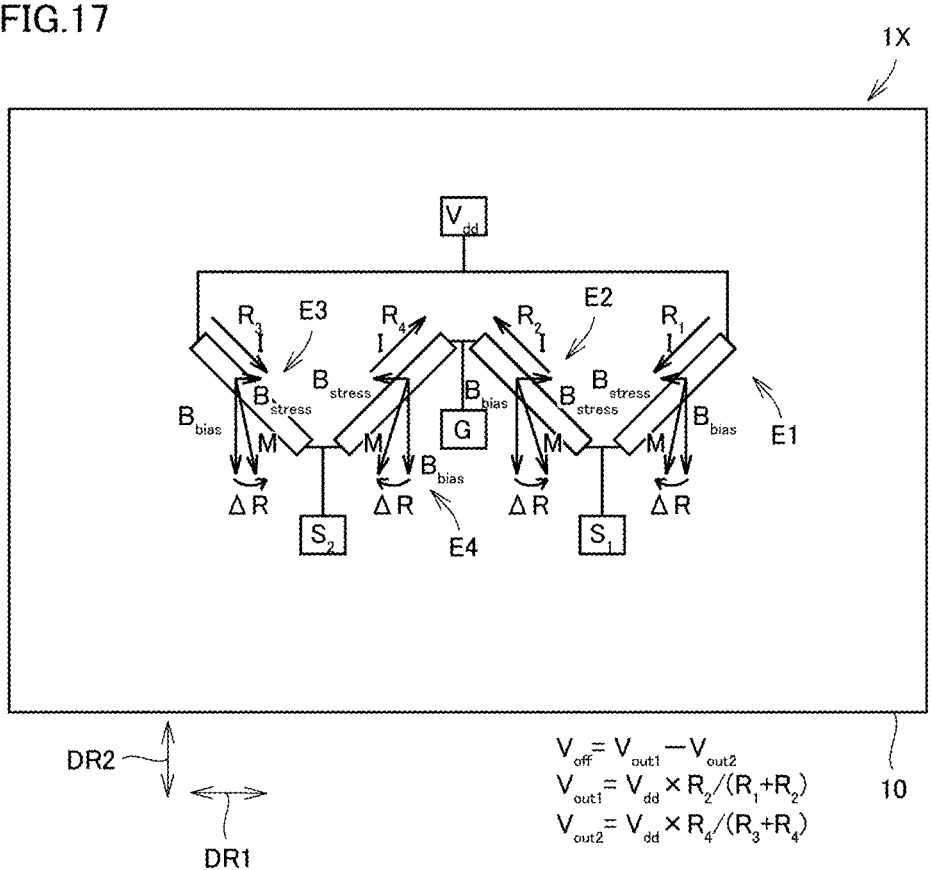
FIG. 15 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the third preferred embodiment of the present invention is pulled in the magneto-sensitive direction.
FIG. 16 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the third preferred embodiment of the present invention is pulled in the magneto-sensitive direction.
FIG. 17 is a diagram showing a pattern of a plurality of magneto-resistive elements defining a magneto-resistive element portion according to a comparative example, and forces which act on each magneto-resistive element, a direction of magnetization of the magneto-resistive element, and the like when a magneto-resistive element is pulled.

FIG. 15 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the third preferred embodiment is pulled in the magneto-sensitive direction.

As shown in FIG. 15, before the magnetic sensor element 1B is pulled in the magneto-sensitive direction, the resistance R1 of the first magneto-resistive element E1 and the resistance R2 of the second magneto-resistive element E2 have the same or substantially the same values, and the resistance R3 of the third magneto-resistive element E3 and the resistance R4 of the fourth magneto-resistive element E4 have the same or substantially the same values, as described above. Accordingly, the midpoint potential Vout1 and the midpoint potential Vout2 calculated from Expressions (1) and (2) described above have values the same or substantially the same as each other. More specifically, the midpoint potential Vout1 and the midpoint potential Vout2 are about 0.5. As a result, a difference Voff which is a difference between the midpoint potential Vout1 and the midpoint potential Vout2 is about 0.

FIG. 16 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the third preferred embodiment is pulled in the magneto-sensitive direction.

As shown in FIG. 16, even after the magnetic sensor element 1B is pulled in the magneto-sensitive direction, the resistance R1 of the first magneto-resistive element E1 and the resistance R2 of the second magneto-resistive element E2 have the same or substantially the same values, and the resistance R3 of the third magneto-resistive element E3 and the resistance R4 of the fourth magneto-resistive element E4 have the same or substantially the same values, as described above. Accordingly, the midpoint potential Vout1 and the midpoint potential Vout2 calculated from Expressions (1) and (2) described above have values the same or substantially the same as each other. More specifically, the midpoint potential Vout1 and the midpoint potential Vout2 are about 0.5. The difference Voff that is the difference between the midpoint potential Vout1 and the midpoint potential Vout2 is thus about 0. As a result, the magnetic sensor according to the third preferred embodiment is able to reduce or prevent Voff that is the difference between the midpoint potential Vout1 and the midpoint potential Vout2 from changing between before and after pulling.

In the magnetic sensor according to the third preferred embodiment as well, when a tensile stress acts on the substrate 10 in the direction parallel or substantially parallel to the magneto-sensitive direction, the stress-induced anisotropy of the magnetic film 13 develops in the direction parallel or substantially parallel to the direction of the bias magnetic field. This improves reliability for stress variation.

Additionally, in the magnetic sensor according to the third preferred embodiment, a multilayer body 11 as a magneto-resistive element portion includes the first magneto-resistive element E1, the second magneto-resistive element E2, the third magneto-resistive element E3, and the fourth magneto-resistive element E4, the first magneto-resistive element E1, the second magneto-resistive element E2, the third magneto-resistive element E3, and the fourth magneto-resistive element E4 are provided side-by-side in a column in the order of the third magneto-resistive element E3, the fourth magneto-resistive element E4, the second magneto-resistive element E2, the first magneto-resistive element E1 along the direction parallel or substantially parallel to the direction of the bias magnetic field and are electrically series-connected, the midpoint potential between the first magneto-resistive element E1 and the second magneto-resistive element E2 is detected from a connecting portion which connects the first magneto-resistive element E1 and the second magneto-resistive element E2, and the midpoint potential between the third magneto-resistive element E3 and the fourth magneto-resistive element E4 is detected from a connecting portion which connects the third magneto-resistive element E3 and the fourth magneto-resistive element E4.

For the above-described reason, it is possible to reduce or prevent variation in the midpoint potential Vout1 and variation in the midpoint potential Vout2 between before and after pulling, as described above.

Comparative Example

FIG. 17 is a diagram showing a pattern of a plurality of magneto-resistive elements defining a magneto-resistive element portion according to a comparative example, and forces which act on each magneto-resistive element, a direction of magnetization of the magneto-resistive element, and the like when a magnetic sensor element is pulled.

As shown in FIG. 17, a magnetic sensor according to the comparative example is different mainly in an arrangement pattern for a plurality of magneto-resistive elements defining a magneto-resistive element portion and in that a magnetic film 13 has a positive magneto-striction constant from the magnetic sensor 100 according to the first preferred embodiment. Other components are the same or similar.

A magnetic sensor element 1X includes a first magneto-resistive element E1, a second magneto-resistive element E2, a third magneto-resistive element E3, and a fourth magneto-resistive element E4 which are provided side-by-side in a row direction. The first magneto-resistive element E1, the second magneto-resistive element E2, the third magneto-resistive element E3, and the fourth magneto-resistive element E4 are provided side-by-side in the order of the third magneto-resistive element E3, the fourth magneto-resistive element E4, the second magneto-resistive element E2, the first magneto-resistive element E1 along a magneto-sensitive direction orthogonal or substantially orthogonal to a direction of a bias magnetic field.

One end side of the third magneto-resistive element E3 is electrically connected to an electrode pad Vdd in accordance with a wiring pattern. The other end side of the third magneto-resistive element E3 is electrically connected to one end side of the fourth magneto-resistive element E4 and is electrically connected to an electrode pad S2, in accordance with the wiring pattern.

The one end side of the fourth magneto-resistive element E4 is connected to the other end side of the third magneto-resistive element E3 and is electrically connected to the electrode pad S2, in accordance with the wiring pattern. The other end side of the fourth magneto-resistive element E4 is electrically connected to one end side of the second magneto-resistive element E2 and is electrically connected to an electrode pad G, in accordance with the wiring pattern.

The one end side of the second magneto-resistive element E2 is electrically connected to the other end side of the fourth magneto-resistive element E4 and is electrically connected to the electrode pad G, in accordance with the wiring pattern. The other end side of the second magneto-resistive element E2 is electrically connected to one end side of the first magneto-resistive element E1 and is electrically connected to an electrode pad S1, in accordance with the wiring pattern.

The one end side of the first magneto-resistive element E1 is electrically connected to the other end side of the second magneto-resistive element E2 and is electrically connected to the electrode pad S1, in accordance with the wiring pattern. The other end side of the second magneto-resistive element E2 is electrically connected to the electrode pad Vdd.

When a voltage is applied between the electrode pad Vdd and the electrode pad G, a midpoint potential Vout1 and a midpoint potential Vout2 are extracted from the electrode pad S1 and the electrode pad S2 in accordance with magnetic field strength.

In this case as well, the midpoint potential Vout1 and the midpoint potential Vout2 are expressed by Expressions (1) and (2) described above, as in the first preferred embodiment.

FIG. 18 is a graph showing change in resistances of the plurality of magneto-resistive elements when the magnetic sensor element according to the comparative example is pulled in a magneto-sensitive direction. Note that, in FIG. 18, a force which acts on the magneto-resistive elements before the pulling is indicated by a broken line, a force which acts on the magneto-resistive elements after the pulling is indicated by a solid line, and the resistance of each magneto-resistive element before and after the pulling is expressed as a numerical value (relative ratio).

As shown in FIG. 18, before the magnetic sensor element 1X is pulled in the magneto-sensitive direction, a stress distribution in a direction (widthwise direction) parallel or substantially parallel to the magneto-sensitive direction has a convex shape raised at a central portion in the widthwise direction due to initial stress. In this case, the second magneto-resistive element E2 and the fourth magneto-resistive element E4 are located near the central portion in the widthwise direction, and the first magneto-resistive element E1 and the third magneto-resistive element E3 are located away from the central portion in the widthwise direction.

Accordingly, a resistance R2 of the second magneto-resistive element E2 and a resistance R4 of the fourth magneto-resistive element E4 are equal or substantially equal. A resistance R1 of the first magneto-resistive element E1 and a resistance R3 of the third magneto-resistive element E3 are equal or substantially equal. In this case, the resistance R2 of the second magneto-resistive element E2 and the resistance R4 of the fourth magneto-resistive element E4 are assumed to be 4, and the resistance R1 of the first magneto-resistive element E1 and the resistance R3 of the third magneto-resistive element E3 are assumed to be 2.

After the magnetic sensor element 1 is pulled in the magneto-sensitive direction, that is, a tensile stress acts on a substrate 10 in the direction parallel or substantially parallel to the magneto-sensitive direction, a stress Bstress acts on each magneto-resistive element, and stress-induced anisotropy of the magnetic film 13 develops in the direction parallel or substantially parallel to the magneto-sensitive direction. Thus, the resistances of the first magneto-resistive element E1, the second magneto-resistive element E2, the third magneto-resistive element E3, and the fourth magneto-resistive element E4 change greatly from those before the magnetic sensor element 1 is pulled in the magneto-sensitive direction.

More specifically, the resistance R1 of the first magneto-resistive element E1 changes from 3 to 2. The resistance R2 of the second magneto-resistive element E2 changes from 4 to 5. The resistance R3 of the third magneto-resistive element E3 changes from 2 to 1. The resistance R4 of the fourth magneto-resistive element E4 changes from 4 to 3.

FIG. 19 is a chart showing a force which acts on each of a first magneto-resistive element to a fourth magneto-resistive element, a midpoint potential between the first magneto-resistive element and the second magneto-resistive element, a midpoint potential between the third magneto-resistive element and the fourth magneto-resistive element, and a difference between the two midpoint potentials, before the magnetic sensor element according to the comparative example is pulled in the magneto-sensitive direction.

As shown in FIG. 19, before the magnetic sensor element 1X is pulled, the resistance R1 of the first magneto-resistive element E1 and the resistance R3 of the third magneto-resistive element E3 have the same or substantially the same values, and the resistance R2 of the second magneto-resistive element E2 and the resistance R4 of the fourth magneto-resistive element E4 have the same or substantially the same values, as described above. Accordingly, the midpoint potential Vout1 and the midpoint potential Vout2 calculated from Expressions (1) and (2) described above have values the same or substantially the same as each other. More specifically, the midpoint potential Vout1 and the midpoint potential Vout2 are about 0.667. As a result, a difference Voff which is a difference between the midpoint potential Vout1 and the midpoint potential Vout2 is about 0.

FIG. 20 is a chart showing a force which acts on each of the first magneto-resistive element to the fourth magneto-resistive element, the midpoint potential between the first magneto-resistive element and the second magneto-resistive element, the midpoint potential between the third magneto-resistive element and the fourth magneto-resistive element, and the difference between the two midpoint potentials, after the magnetic sensor element according to the comparative example is pulled in the magneto-sensitive direction.

As shown in FIG. 20, after the magnetic sensor element 1X is pulled in the magneto-sensitive direction, the resistance R1 of the first magneto-resistive element E1 and the resistance R4 of the fourth magneto-resistive element E4 have the same or substantially the same values. A value of the resistance R2 of the second magneto-resistive element E2, however, is different from a value of the resistance R4 of the fourth magneto-resistive element E4.

For the above-described reason, the midpoint potential Vout1 and the midpoint potential Vout2 calculated from Expressions (1) and (2) described above have values different from each other. More specifically, the midpoint potential Vout1 is about 0.625 while the midpoint potential Vout2 is about 0.75. Thus, Voff that is the difference between the midpoint potential Vout1 and the midpoint potential Vout2 is about −0.125.

As described above, in the magnetic sensor according to the comparative example, the stress-induced anisotropy of the magnetic film 13 develops in the direction parallel or substantially parallel to the magneto-sensitive direction. The development causes not only variation in the midpoint potential Vout1 and the midpoint potential Vout2 between before and after pulling but also variation in Voff. This lowers reliability for stress variation in the magnetic sensor according to the comparative example.

Modification

FIG. 21 is a diagram showing forces which act when a magnetic sensor element according to a modification of a preferred embodiment of the present invention is compressed in a magneto-sensitive direction. A magnetic sensor according to the modification will be described with reference to FIG. 21.

As shown in FIG. 21, the magnetic sensor according to the modification is different in the magnetic film 13 of the magnetic sensor element 1 from the magnetic sensor 100 according to the first preferred embodiment. Other components are the same or similar.

In the modification, the magnetic film 13 has a positive magneto-striction constant. The magnetic film 13 has a magneto-striction constant λ that satisfies about −1 ppm<λ<about 0 ppm. In the modification, in response to a compressive stress acting on the substrate 10 in a direction parallel or substantially parallel to a magneto-sensitive direction, stress-induced anisotropy of the magnetic film develops in a direction parallel or substantially parallel to a direction of a bias magnetic field.

With the features described above, the magnetic sensor according to the modification provides the same or similar effects as the magnetic sensor according to the first preferred embodiment.

Note that although a case where a pattern of a plurality of magneto-resistive elements in a multilayer body as a magneto-resistive element portion is the same or substantially the same pattern as in the first preferred embodiment has been provided as an example in the modification, the present invention is not limited to this. The pattern may be the same or substantially the same pattern as in the second preferred embodiment or the third preferred embodiment.

Other Modifications

Although a case where the first magneto-resistive element E1 to the fourth magneto-resistive element E4 each have a linear shape has been provided as an example in each of the first to third preferred embodiments and the modification, the present invention is not limited to these. The first magneto-resistive element E1 to the fourth magneto-resistive element E4 may have a meandering shape formed by alternately connecting long strip-shaped patterns and short strip-shaped patterns that are orthogonal or substantially orthogonal.

Although a case where one Wheatstone bridge circuit which includes four resistance regions is provided within the magnetic sensor element 1 has been provided as an example in each of the first to third preferred embodiments and the modification, the present invention is not limited to these. For example, a bridge circuit may not be constructed within the magnetic sensor 1, and a magneto-resistive element portion may be defined by only one resistor. Alternatively, a plurality of bridge circuits may be provided within one magnetic sensor element 1.

Fourth Preferred Embodiment

Current Sensor

Figure 22:
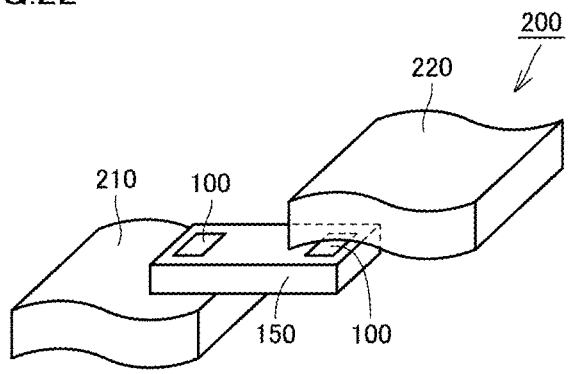
FIG. 22 is a perspective view of a current sensor according to a fourth preferred embodiment of the present invention.
Figure 23:
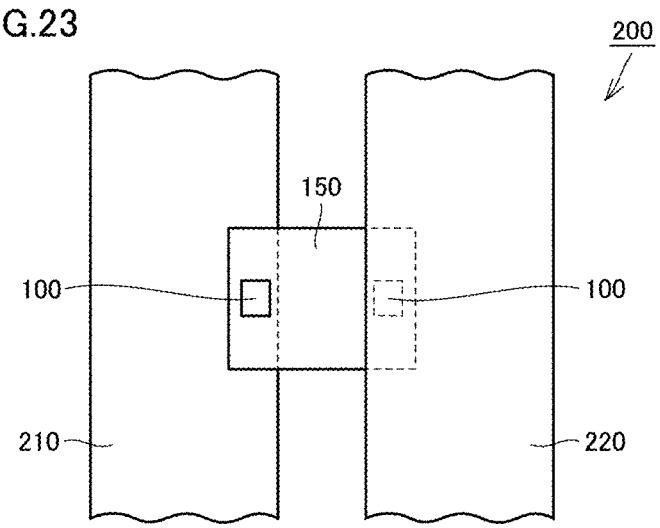
FIG. 23 is a plan view of the current sensor according to the fourth preferred embodiment of the present invention.
Figure 24:
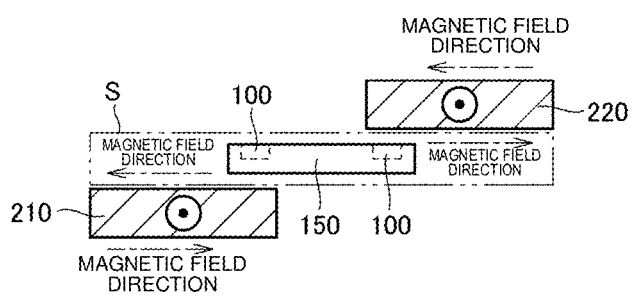
FIG. 24 is a front view of the current sensor according to the fourth preferred embodiment of the present invention.

FIG. 22 is a perspective view of a current sensor according to a fourth preferred embodiment of the present invention. FIG. 23 is a plan view of the current sensor according to the fourth preferred embodiment. FIG. 24 is a front view of the current sensor according to the fourth preferred embodiment.

As shown in FIGS. 22 to 24, a current sensor 200 includes a support substrate 150 and two magnetic sensors 100. The current sensor 200 detects currents which flow through objects to be detected on the basis of magnetism detection by the magnetic sensors 100.

The two magnetic sensors 100 have the same or similar configurations as the magnetic sensor 100 according to the first preferred embodiment.

The support substrate 150 includes, for example, an integrated chip. The two magnetic sensors 100 are mounted on the support substrate 150. A circuit (not shown) which subjects a signal output from each of the two magnetic sensors 100 to predetermined signal processing (for example, differential amplification) is provided in or on the support substrate 150.

One end side of the current sensor 200 in a left-right direction in FIG. 24 is located above a busbar 210 and the other end side of the current sensor 200 in the left-right direction in FIG. 24 is located below a busbar 220. The current sensor 200 is provided in a level-difference space S which is indicated by an alternate long and two short dashes line shown in FIG. 24 and is formed between the busbar 210 and the busbar 220.

Currents as measurement objects flow through the busbars 210 and 220. The busbar 210 and the busbar 220 are juxtaposed to each other when seen in a normal direction thereof. The busbar 210 and the busbar 220 are shifted in an up-down direction. The busbars 210 and 220 are constructed by, for example, bifurcating a bar-shaped conductor for a power supply connected to a car-mounted battery.

The current sensor 200 detects magnetism (magnetic fields) given from the busbars 210 and 220 with the two magnetic sensors 100. In this case, a direction of a bias magnetic field applied from a magnet (not shown) to a magneto-resistive element is a front-back direction in FIG. 24. A magnetism detection direction (magneto-sensitive direction) of the current sensor 200 is the left-right direction in FIG. 24.

The busbar 210 is located on a reverse side of the support substrate 150, and the busbar 220 is located on an obverse side of the support substrate 150. Accordingly, when currents flow through the busbars 210 and 220 in a direction of an arrow shown in FIG. 23, magnetic vectors in directions (the left-right direction in FIG. 24) parallel or substantially parallel to an obverse surface of the support substrate 150 and in directions different from (opposed to) each other are given to each of the two magnetic sensors 100 (see alternate long and short dash line arrows in FIG. 24).

The magnetic vectors are detected as respective voltage values (Hall voltages) by the two magnetic sensors 100. Accordingly, the currents flowing through the busbar 210 and the busbar 220 are able to be detected (differentially detected) on the basis of a differentially amplified value of the detected magnetic vectors (voltage values).

As described above, the impact of disturbance (a disturbance magnetic field) is cancelled out (offset) and removed by calculating a difference value of magnetic vectors (doing a subtraction). Only signal components corresponding to magnetism (magnetic fields) that arises from currents flowing through the above-described objects to be detected (busbars) are extracted and detected.

The current sensor 200 according to the fourth preferred embodiment includes the two magnetic sensors 100 according to the first preferred embodiment and provides the same or similar effects as the first preferred embodiment.

Note that although a case where the current sensor 200 includes the magnetic sensor 100 according to the first preferred embodiment has been provided as an example in the fourth preferred embodiment, the present disclosure is not limited to this. The current sensor 200 may include any of the magnetic sensors according to the second and third preferred embodiments, the modification, and the other modifications.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
a substrate; and
a magneto-resistive element portion provided on the substrate and having a predetermined magneto-sensitive direction, and in which a bias magnetic field is applied in a direction orthogonal or substantially orthogonal to the magneto-sensitive direction; wherein
the magneto-resistive element portion includes a magnetic film having a negative magneto-striction constant; and
stress-induced anisotropy of the magnetic film develops in a direction parallel or substantially parallel to the direction of the bias magnetic field in response to a tensile stress acting on the substrate in a direction parallel or substantially parallel to the magneto-sensitive direction.

2. The magnetic sensor according to claim 1, wherein the substrate has an elongated shape with a lengthwise direction; and
the magneto-sensitive direction is parallel or substantially parallel to the lengthwise direction.

3. The magnetic sensor according to claim 1, wherein the magneto-resistive element portion includes a first magneto-resistive element, a second magneto-resistive element, a third magneto-resistive element, and a fourth magneto-resistive element;
the first magneto-resistive element, the second magneto-resistive element, the third magneto-resistive element, and the fourth magneto-resistive element are provided side-by-side in a column in order of the third magneto-resistive element, the fourth magneto-resistive element, the second magneto-resistive element, and the first magneto-resistive element along the direction parallel or substantially parallel to the direction of the bias magnetic field and are electrically series-connected;
a midpoint potential between the first magneto-resistive element and the second magneto-resistive element is detected from a connecting portion which connects the first magneto-resistive element and the second magneto-resistive element; and
a midpoint potential between the third magneto-resistive element and the fourth magneto-resistive element is detected from a connecting portion which connects the third magneto-resistive element and the fourth magneto-resistive element.

4. The magnetic sensor according to claim 1, wherein the magneto-resistive element portion includes a first magneto-resistive element, a second magneto-resistive element, a third magneto-resistive element, and a fourth magneto-resistive element which are provided in a matrix; and
the first magneto-resistive element, the second magneto-resistive element, the third magneto-resistive element, and the fourth magneto-resistive element define a full-bridge circuit.

5. The magnetic sensor according to claim 4, wherein the first magneto-resistive element and the second magneto-resistive element are provided side-by-side in a column along the direction parallel or substantially parallel to the direction of the bias magnetic field and define a first half-bridge circuit;
the third magneto-resistive element and the fourth magneto-resistive element are provided side-by-side in a column along the direction parallel or substantially parallel to the direction of the bias magnetic field and define a second half-bridge circuit;
the first half-bridge circuit and the second half-bridge circuit define the full-bridge circuit;
a midpoint potential between the first magneto-resistive element and the second magneto-resistive element is detected from a connecting portion which connects the first magneto-resistive element and the second magneto-resistive element; and
a midpoint potential between the third magneto-resistive element and the fourth magneto-resistive element is detected from a connecting portion which connects the third magneto-resistive element and the fourth magneto-resistive element.

6. The magnetic sensor according to claim 5, wherein the first magneto-resistive element and the second magneto-resistive element are provided side-by-side in a column along the direction parallel or substantially parallel to the direction of the bias magnetic field and define a first half-bridge circuit;

the third magneto-resistive element and the fourth magneto-resistive element are provided side-by-side in a column along the direction parallel or substantially parallel to the direction of the bias magnetic field and define a second half-bridge circuit;

the first half-bridge circuit and the second half-bridge circuit define the full-bridge circuit;

a midpoint potential between the first magneto-resistive element and the second magneto-resistive element is detected from a connecting portion which connects the first magneto-resistive element and the second magneto-resistive element; and a midpoint potential between the third magneto-resistive element and the fourth magneto-resistive element is detected from a connecting portion which connects the third magneto-resistive element and the fourth magneto-resistive element.

7. The magnetic sensor according to claim 5, wherein an end of the first magneto-resistive element that is not connected to the second magneto-resistive element is connected to a voltage source; and an end of the second magneto-resistive element that is not connected to the first magneto-resistive element is connected to ground.

8. A current sensor comprising:

a busbar through which a current as a measurement object flows; and the magnetic sensor according to claim 1.

9. The magnetic sensor according to claim 1, wherein the magneto-resistive element portion is a multilayer body that includes an underlying film, the magnetic film, and a protective film stacked in order.

10. The magnetic sensor according to claim 9, wherein the underlying film is single metal film or a multilayer film including a plurality of metal films.

11. The magnetic sensor according to claim 9, wherein the protective film is single metal film or a multilayer film including a plurality of metal films.

12. The magnetic sensor according to claim 1, wherein the magnetic film provides a magneto-striction constant $\lambda$ that satisfies about $-1$ ppm $<\lambda<$ about 0 ppm.

13. The magnetic sensor according to claim 1, further comprising a pair of electrode portions provided at different end surfaces of the magneto-resistive element.

14. The magnetic sensor according to claim 1, wherein the magneto-resistive element is covered by a protective layer that includes an insulating material.

15. The magnetic sensor according to claim 1, wherein the bias magnetic field is applied by a permanent magnet.

16. A magnetic sensor comprising:

a substrate; and a magneto-resistive element portion provided on the substrate and having a predetermined magneto-sensitive direction, and in which a bias magnetic field is applied in a direction orthogonal or substantially orthogonal to the magneto-sensitive direction; wherein the magneto-resistive element portion includes a magnetic film having a positive magneto-striction constant; and stress-induced anisotropy of the magnetic film develops in a direction parallel or substantially parallel to the direction of the bias magnetic field in response to a compressive stress acting on the substrate in a direction parallel or substantially parallel to the magneto-sensitive direction.

17. The magnetic sensor according to claim 16, wherein the substrate has an elongated shape with a lengthwise direction; and the magneto-sensitive direction is parallel or substantially parallel to the lengthwise direction.

18. The magnetic sensor according to claim 16, wherein the magneto-resistive element portion includes a first magneto-resistive element, a second magneto-resistive element, a third magneto-resistive element, and a fourth magneto-resistive element;

the first magneto-resistive element, the second magneto-resistive element, the third magneto-resistive element, and the fourth magneto-resistive element are provided side-by-side in a column in order of the third magneto-resistive element, the fourth magneto-resistive element, the second magneto-resistive element, and the first magneto-resistive element along the direction parallel or substantially parallel to the direction of the bias magnetic field and are electrically series-connected;

a midpoint potential between the first magneto-resistive element and the second magneto-resistive element is detected from a connecting portion which connects the first magneto-resistive element and the second magneto-resistive element; and a midpoint potential between the third magneto-resistive element and the fourth magneto-resistive element is detected from a connecting portion which connects the third magneto-resistive element and the fourth magneto-resistive element.

19. The magnetic sensor according to claim 16, wherein the magneto-resistive element portion includes a first magneto-resistive element, a second magneto-resistive element, a third magneto-resistive element, and a fourth magneto-resistive element which are provided in a matrix; and the first magneto-resistive element, the second magneto-resistive element, the third magneto-resistive element, and the fourth magneto-resistive element define a full-bridge circuit.

20. A current sensor comprising:

a busbar through which a current as a measurement object flows; and the magnetic sensor according to claim 16.

* * * * *